US008933456B2

(12) United States Patent
Bedell et al.

(10) Patent No.: US 8,933,456 B2
(45) Date of Patent: Jan. 13, 2015

(54) GERMANIUM-CONTAINING RELEASE LAYER FOR TRANSFER OF A SILICON LAYER TO A SUBSTRATE

(75) Inventors: Stephen W. Bedell, Wappingers Falls, NY (US); Keith E. Fogel, Hopewell Junction, NY (US); Daniel A. Inns, Palo Alto, CA (US); Jeehwan Kim, Los Angeles, CA (US); Devendra K. Sadana, Pleasantville, NY (US); Katherine L. Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 13/616,322

(22) Filed: Sep. 14, 2012

(65) Prior Publication Data

US 2013/0015455 A1    Jan. 17, 2013

Related U.S. Application Data

(62) Division of application No. 12/912,940, filed on Oct. 27, 2010, now Pat. No. 8,298,923.

(51) Int. Cl.
*H01L 29/38* (2006.01)
*H01L 21/02* (2006.01)
*H01L 21/762* (2006.01)

(52) U.S. Cl.
CPC ........ *H01L 21/0262* (2013.01); *H01L 21/0245* (2013.01); *H01L 21/02532* (2013.01); *H01L 21/02576* (2013.01); *H01L 21/02579* (2013.01); *H01L 21/02664* (2013.01); *H01L 21/76254* (2013.01)

USPC .......................................................... 257/64

(58) Field of Classification Search
None
See application file for complete search history.

(56) References Cited

U.S. PATENT DOCUMENTS

| 7,755,109 B2 | 7/2010 | Atwater et al. |
| 2006/0249790 A1 | 11/2006 | Chen et al. |
| 2007/0170541 A1 | 7/2007 | Chui et al. |
| 2009/0017602 A1* | 1/2009 | Damlencourt et al. ....... 438/481 |
| 2010/0052104 A1 | 3/2010 | Signamarcheix et al. |

* cited by examiner

*Primary Examiner* — Alexander Ghyka
*Assistant Examiner* — Stanetta Isaac
(74) *Attorney, Agent, or Firm* — Scully, Scott, Murphy & Presser, P.C.; Catherine Ivers, Esq.

(57) ABSTRACT

A germanium-containing layer is deposited on a single crystalline bulk silicon substrate in an ambient including a level of oxygen partial pressure sufficient to incorporate 1%-50% of oxygen in atomic concentration. The thickness of the germanium-containing layer is preferably limited to maintain some degree of epitaxial alignment with the underlying silicon substrate. Optionally, a graded germanium-containing layer can be grown on, or replace, the germanium-containing layer. An at least partially crystalline silicon layer is subsequently deposited on the germanium-containing layer. A handle substrate is bonded to the at least partially crystalline silicon layer. The assembly of the bulk silicon substrate, the germanium-containing layer, the at least partially crystalline silicon layer, and the handle substrate is cleaved within the germanium-containing layer to provide a composite substrate including the handle substrate and the at least partially crystalline silicon layer. Any remaining germanium-containing layer on the composite substrate is removed.

19 Claims, 10 Drawing Sheets

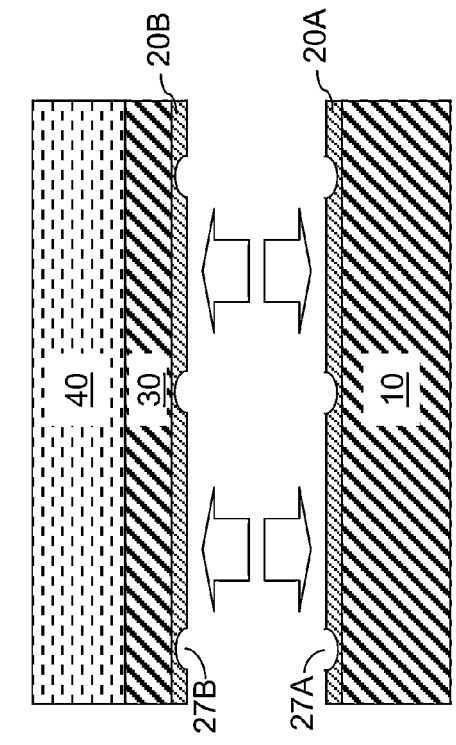
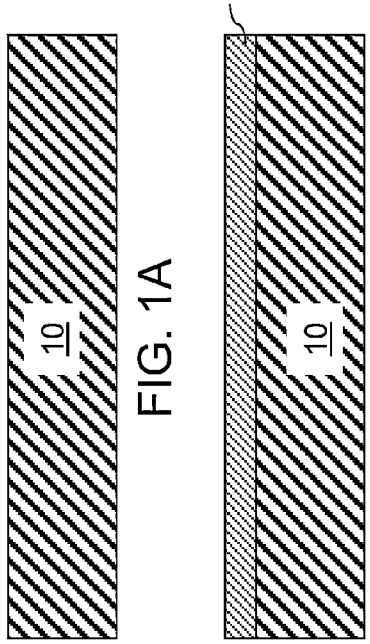
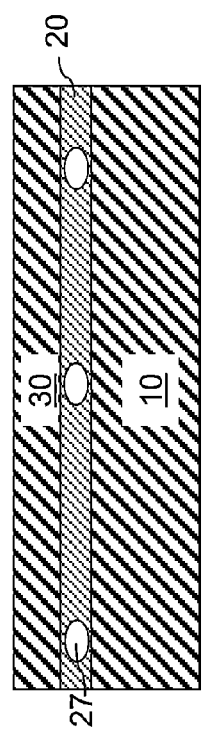
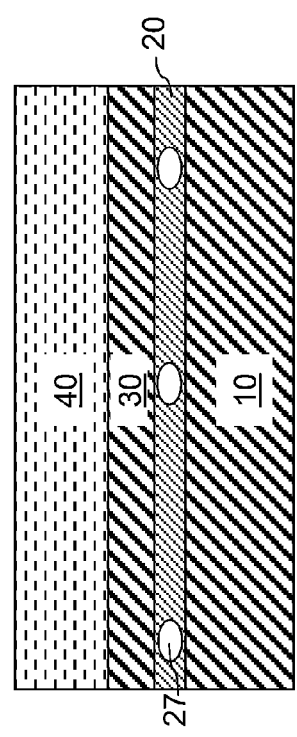
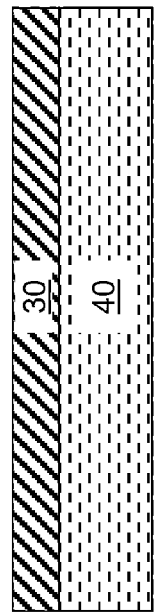

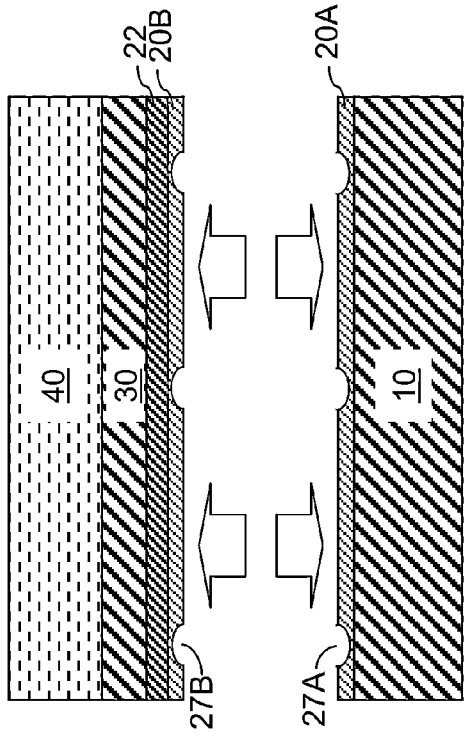
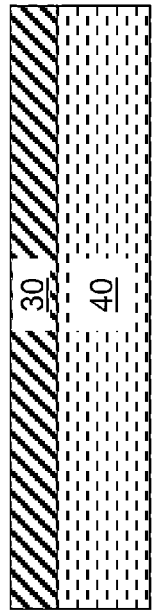
FIG. 2E
FIG. 2F
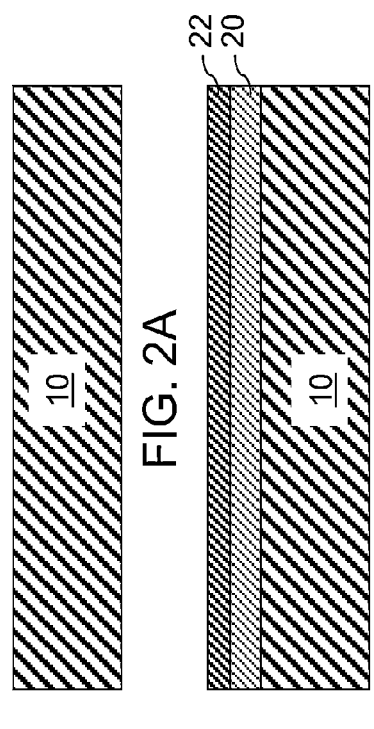
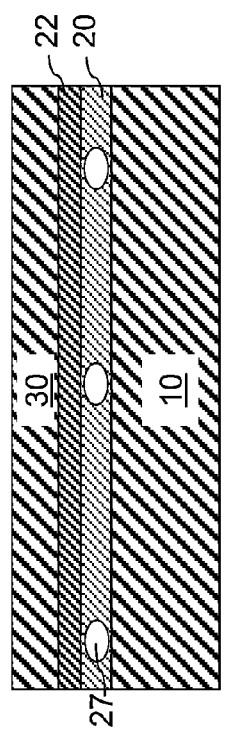
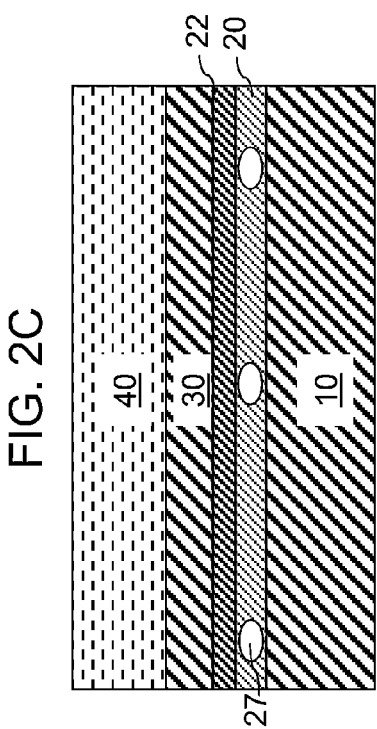
FIG. 2A
FIG. 2B
FIG. 2C
FIG. 2D

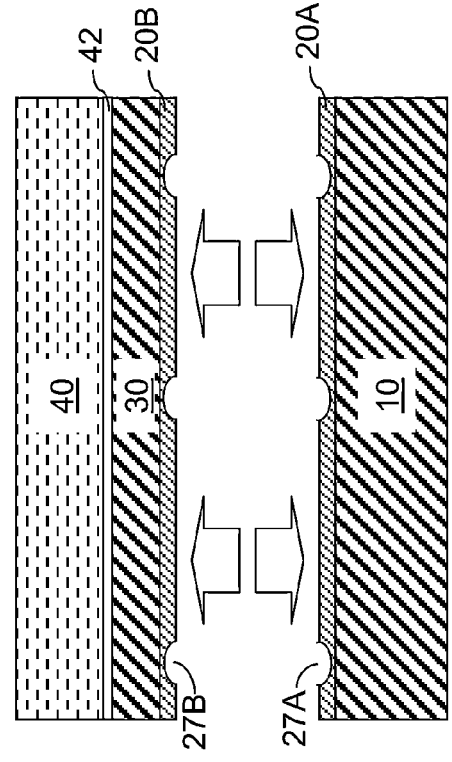
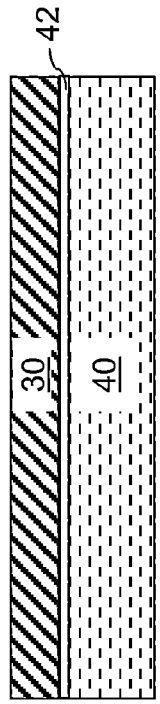
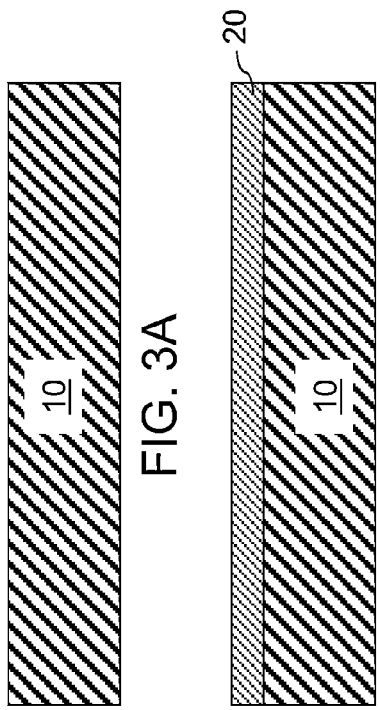
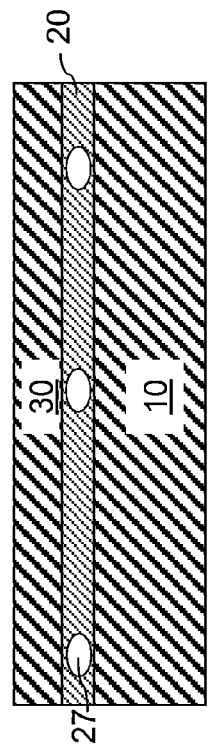
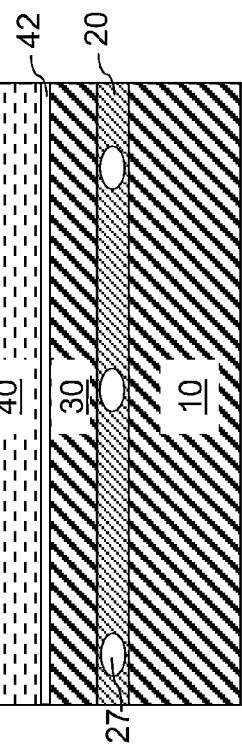

GERMANIUM-CONTAINING RELEASE LAYER FOR TRANSFER OF A SILICON LAYER TO A SUBSTRATE

CROSS REFERENCE TO RELATED APPLICATION

This application is a divisional of U.S. patent application Ser. No. 12/912,940, filed Oct. 27, 2010 the entire content and disclosure of which is incorporated herein by reference.

BACKGROUND

The present disclosure relates to a method of forming a semiconductor structure, and more particularly to a method of forming a semiconductor structure including a transferred semiconductor layer, and structures for effecting the same and formed by the same.

A substrate including a thin silicon layer can be formed by employing a hydrogen-containing cleavage layer. For example, hydrogen ions (protons) can be implanted into a bulk silicon substrate to form a hydrogen-containing layer at a constant depth from a top surface of the bulk silicon substrate. A handle substrate is bonded to the top surface of the bulk silicon substrate, and the bulk silicon substrate is subsequently cleaved at the hydrogen-containing layer so that a thin silicon layer above the hydrogen-containing layer is "transferred" to the handle substrate to form a new substrate, which is an assembly of the handle substrate and the transferred thin silicon layer. The remaining portion of the bulk substrate is planarized by chemical mechanical planarization and re-used to provide another thin silicon layer for another layer transfer process until the thickness of the bulk substrate becomes too thin to be employed for layer transfer purposes.

The method of forming a substrate including a thin silicon layer employing hydrogen implantation is subject to many limitations. First, a hydrogen-containing layer must be formed through hydrogen implantation. Because of inherent depth distribution of the implanted hydrogen ions, a high dose of hydrogen ions must be implanted into the bulk silicon substrate to be able to induce cleavage at the hydrogen-containing layer. Because the vertical distribution range of the hydrogen ions increases with increasing depth of implantation, higher dose of hydrogen ions is needed as the depth of the hydrogen-containing layer increases.

Further, due to the propensity of bulk silicon substrates to cleave along major crystallographic planes, cleavage along only some crystallographic orientations of a silicon crystal produces clean cleavage planes with atomic planarity, while cleavage along other crystallographic orientations can produce cleavage planes that include facets and/or rough surfaces that need to be planarized, for example, by chemical mechanical planarization.

Yet further, the bulk substrate after cleavage needs to be planarized before re-usage. In addition, any modification to the dopant concentration in the transferred layer requires additional processes that include implantation or plasma treatment and dopant activation by a high temperature anneal.

Thus, a process of forming a transferred silicon layer without employing hydrogen ion implantation is desired.

SUMMARY

A germanium-containing layer is deposited on a single crystalline bulk silicon substrate in an ambient including a level of oxygen partial pressure sufficient to incorporate 1%-50% of oxygen in atomic concentration. The thickness of the germanium-containing layer may be limited to facilitate some degree of epitaxial alignment with the underlying silicon substrate. Optionally, a graded germanium-containing layer including a graded silicon-germanium alloy can be grown on, or replace, the germanium-containing layer. An at least partially crystalline silicon layer is subsequently deposited on the germanium-containing layer. A handle substrate is bonded to the at least partially crystalline silicon layer. The assembly of the bulk silicon substrate, the germanium-containing layer, the at least partially crystalline silicon layer, and the handle substrate is cleaved within the germanium-containing layer to provide a composite substrate including the handle substrate and the at least partially crystalline silicon layer. Any remaining portion of the germanium-containing layer on the composite substrate is removed.

According to an aspect of the present disclosure, a method of forming a semiconductor structure includes: growing a germanium-containing layer on a single crystalline silicon substrate; growing an at least partially crystalline silicon layer on the germanium-containing layer; bonding a handle substrate to the at least partially crystalline silicon layer; and cleaving an assembly of the handle substrate and the at least partially crystalline silicon layer off the single crystalline silicon substrate along a plane in the germanium-containing layer.

According to another aspect of the present disclosure, a semiconductor structure including a material stack, which includes: a single crystalline silicon substrate; a germanium-containing layer contacting the single crystalline silicon substrate; an at least partially crystalline silicon layer located on the germanium-containing layer; and a handle substrate bonded to the at least partially crystalline silicon layer.

BRIEF DESCRIPTION OF THE SEVERAL VIEWS OF THE DRAWINGS

FIG. 1A-1F are vertical cross-sectional views of a first exemplary semiconductor structure according to a first embodiment of the present disclosure.

FIG. 2A-2F are vertical cross-sectional views of a second exemplary semiconductor structure according to a second embodiment of the present disclosure.

FIG. 3A-3F are vertical cross-sectional views of a third exemplary semiconductor structure according to a third embodiment of the present disclosure.

DETAILED DESCRIPTION

Figure 4A:
FIG. 4A-4F are vertical cross-sectional views of a fourth exemplary semiconductor structure according to a fourth embodiment of the present disclosure.

As stated above, the present disclosure relates to a method of forming a semiconductor structure including a transferred semiconductor layer, and structures for effecting the same and formed by the same, which are now described in detail with accompanying figures. Throughout the drawings, the same reference numerals or letters are used to designate like or equivalent elements. The drawings are not necessarily drawn to scale.

As used herein, a "textured crystalline layer" is a polycrystalline layer including grains, in which a predominant portion of the grains have the same set of crystallographic orientations. A "predominant portion" of an element refers to more than 50% in volume of the element. Likewise, as used herein, a "polycrystalline layer" is a more general term that includes both textured crystalline layers and crystalline layers including grains with a mix of crystallographic orientations with no single dominant orientation.

As used herein, an "at least partially crystalline layer" is a layer that is either a single crystalline layer, a textured crystalline layer, or polycrystalline layer.

As used herein, an "at least partially crystalline silicon layer" is an at least partially crystalline layer including intrinsic silicon or doped silicon.

Referring to FIG. 1A, a first exemplary semiconductor structure according to a first embodiment of the present disclosure includes a single crystalline semiconductor substrate 10. In one embodiment, the single crystalline semiconductor substrate 10 consists of intrinsic silicon or doped silicon. In one embodiment, the single crystalline silicon substrate 10 is a bulk silicon. In this embodiment, the single crystalline silicon substrate 10 is thick enough to allow mechanical handling of the single crystalline silicon substrate 10 without breakage, and can have a thickness from 200 microns to 2,000 microns. In another embodiment, the single crystalline silicon substrate 10 can be attached to another substrate that facilitates handling of the single crystalline silicon substrate 10. For example, the single crystalline silicon substrate 10 can be attached to an insulating substrate or a conductive substrate. In this embodiment, the single crystalline silicon substrate 10 can have a thickness from 5 microns to 2,000 microns.

The surface normal of a planar top surface of the single crystalline silicon substrate 10 can have any crystallographic orientation. In one embodiment, the surface normal of the planar top surface of the single crystalline silicon substrate 10 can have a "major crystallographic orientation," which is defined herein as an orientation having a set of Miller indices in which each Miller index in the set of Miller indices has an absolute value that does not exceed 6. In another embodiment, the surface normal of the planar top surface of the single crystalline silicon substrate 10 can have a "non-major crystallographic orientation," which is defined herein as an orientation having a set of Miller indices in which at least one Miller index in the set of Miller indices has an absolute value that exceeds 6. Thus, the orientation of the surface normal of a planar top surface of the single crystalline silicon substrate 10 is not limited in any way. Non-conventional surface orientations having a "high Miller index," i.e., a Miller index having an absolute value that exceeds 6, can be provided on the single crystalline silicon substrate 10 by angled polishing on a conventional single crystalline silicon substrate having "low Miller indices," i.e., Miller indices having absolute values that do not exceed 6.

Referring to FIG. 1B, a germanium-containing layer 20 is grown directly on the top surface of the single crystalline silicon substrate 10, preferably with at least some degree of epitaxial alignment. The degree of epitaxial alignment between the germanium-containing layer 20 and the single crystalline silicon substrate 10 may be complete or incomplete, depending on embodiments. In one embodiment, the germanium-containing layer 20 is a single crystalline layer having an epitaxial alignment with the single crystalline silicon substrate 10 at an atomic level. In another embodiment, the germanium-containing layer 20 is a textured crystalline layer in which grains are predominantly oriented in a direction providing epitaxial alignment with the single crystalline structure of the single crystalline silicon substrate 10 at an atomic level. In this embodiment, a predominant portion of the grains of the germanium-containing layer 20 has the same set of crystallographic orientations as the single crystalline silicon substrate 10. In yet another embodiment, germanium-containing layer 20 may be polycrystalline.

The germanium-containing layer 20 is grown in an ambient having an oxygen partial pressure at a level that incorporates oxygen into the germanium-containing layer 20 at an atomic concentration between 1% and 50%, and typically between 2% and 20%. The oxygen partial pressure can be provided by residual gases in a high vacuum environment having a base pressure of $10^{-6}$ Torr to 100 mTorr, and typically from $10^{-5}$ Torr and 10 mTorr. Alternately, the oxygen partial pressure can be provided by supplying an oxygen-containing gas such as oxygen, ozone, or carbon dioxide in an ultrahigh vacuum environment having a base pressure less than $10^{-6}$ Torr. Yet alternately or in addition, the germanium-containing layer 20 can be deposited in an environment having a low oxygen partial pressure such that the germanium-containing layer 20 has an atomic concentration of oxygen less than 1% as deposited. In this case, the germanium-containing layer 20 can be exposed to an oxygen-containing ambient to allow adsorption of oxygen and subsequent incorporation of oxygen into the germanium-containing layer 20 at an atomic concentration between 1% and 50%, and typically between 2% and 20%.

In one embodiment, the germanium-containing layer 20 can have a substantially constant germanium concentration at an atomic concentration from 30% to 99%. The germanium concentration is "substantially constant" because statistical variations in germanium concentration is inherently present due to the statistical nature of composition of the germanium-containing layer 20. In one case, the germanium-containing layer 20 can include germanium and oxygen, and the sum of the atomic concentration of germanium and the atomic concentration of oxygen is greater than 99%. The germanium-containing layer 20 may consist essentially of germanium and oxygen, and the sum of the atomic concentration of germanium and the atomic concentration of oxygen is greater than 99%. In another case, the germanium-containing layer 20 can include germanium, silicon, and oxygen, and the sum of the atomic concentration of germanium, the atomic concentration of silicon, and the atomic concentration of oxygen is greater than 99%. The germanium-containing layer 20 may consist essentially of germanium, silicon, and oxygen, and the sum of the atomic concentration of germanium, the atomic concentration of silicon, and the atomic concentration of oxygen is greater than 99%. In yet another case, the germanium-containing layer 20 can include germanium, silicon, at least another atom, and oxygen, and the sum of the atomic concentration of germanium, the atomic concentration of silicon, the atomic concentration of the at least another atom, and the atomic concentration of oxygen is greater than 99%. The germanium-containing layer 20 may consist essentially of germanium, silicon, at least another atom, and oxygen, and the sum of the atomic concentration of germanium, the atomic concentration of silicon, the atomic concentration of the at least another atom, and the atomic concentration of oxygen is greater than 99%. The at least another atom can be carbon, a p-type dopant such as boron, gallium, or indium, an n-type dopant such as phosphorus, arsenic, or antimony, any other impurity atoms such as nitrogen, fluorine, hydrogen, or argon, or a combination thereof.

In another embodiment, the germanium-containing layer 20 can include silicon, germanium, and oxygen. The atomic concentration of germanium decreases in the germanium-containing layer 20 with the distance from the single crystalline silicon substrate 10. Thus, the atomic concentration of germanium in the germanium-containing layer 20 has variable values, which can be in a range from 0% and 99%. In this case, the atomic concentration of germanium in the graded germanium-containing layer 20 has a maximum value that is at least 50%, which occurs at or near the interface with the single crystalline silicon substrate 10. In one case, the germanium-containing layer 20 can include germanium, silicon, and oxygen, and the sum of the atomic concentration of germanium, the atomic concentration of silicon, and the atomic concentration of oxygen is greater than 99% in each location within the germanium-containing layer 20. The germanium-containing layer 20 may consist essentially of germanium, silicon, and oxygen, and the sum of the atomic concentration of germanium, the atomic concentration of silicon, and the atomic concentration of oxygen is greater than 99% in each location within the germanium-containing layer 20. In another case, the germanium-containing layer 20 can include germanium, silicon, at least another atom, and oxygen, and the sum of the atomic concentration of germanium, the atomic concentration of silicon, the atomic concentration of the at least another atom, and the atomic concentration of oxygen is greater than 99% in each location within the germanium-containing layer 20. The germanium-containing layer 20 may consist essentially of germanium, silicon, at least another atom, and oxygen, and the sum of the atomic concentration of germanium, the atomic concentration of silicon, the atomic concentration of the at least another atom, and the atomic concentration of oxygen is greater than 99% in each location within the germanium-containing layer 20. The at least another atom can be carbon, a p-type dopant such as boron, gallium, or indium, an n-type dopant such as phosphorus, arsenic, or antimony, any other impurity atoms such as nitrogen, fluorine, hydrogen, or argon, or a combination thereof.

In one embodiment, germanium-containing layer 20 is at least partially epitaxial. The thickness of the germanium-containing layer 20 is maintained not to exceed the critical thickness at which the epitaxial alignment between the single crystalline silicon substrate 10 and the germanium-containing layer 20 is destroyed through stress relaxation. The oxygen content of germanium-containing layer 20 is also kept low (e.g., 1-3%) to help preserve epitaxy. In another embodiment, the thickness of the germanium-containing layer 20 may be less than, the same as, or exceed the critical thickness at which the epitaxial alignment between the single crystalline silicon substrate 10 and the germanium-containing layer 20 is destroyed through stress relaxation. If the thickness of the germanium-containing layer 20 exceeds the critical thickness, the germanium-containing layer 20 may develop dislocations therein.

If the thickness of the germanium-containing layer 20 does not exceed the critical thickness, the thickness of the germanium-containing layer 20 is between 5 nm and 80 nm, and preferably between 10 nm and 60 nm, although lesser and greater thicknesses can also be employed depending on the concentration of germanium provided that at least some epitaxial alignment between the germanium-containing layer 20 and the single crystalline silicon substrate 10 is maintained.

The germanium-containing layer 20 can be deposited by chemical vapor deposition (CVD), vacuum evaporation, or atomic layer deposition (ALD). The deposition temperature is set at a temperature that provides sufficient surface diffusion to germanium atoms and silicon atoms, if silicon is incorporated in the germanium-containing layer 20, and any other atoms, if any other atoms are incorporated into the germanium-containing layer 20. For example, the deposition temperature can be 450° C. to 900° C., and typically from 500° C. to 700° C. The pressure of the deposition chamber can vary depending on the deposition process employed. In general, chemical vapor deposition processes employ deposition conditions including a total pressure from 0.1 Torr to 10 Torr, and typically from 0.2 Torr to 5 Torr. A predominant portion of the total pressure is the partial pressure of a carrier gas. If vacuum evaporation or atomic layer deposition is employed, the deposition pressure is typically from $10^{-6}$ Torr to $10^{-3}$ Torr, depending on the base pressure of the deposition system and whether oxygen gas is flowed into the deposition chamber in addition to residual oxygen gases inherently present in any vacuum chamber having a finite (non-zero) base pressure. In case atomic layer deposition is employed, at least one reactant gas and oxygen gas can be alternately flowed into a deposition chamber with optional adjustments to the temperature of the single crystalline silicon substrate 10 to control the amount of oxygen incorporated into the germanium-containing layer 20.

In case chemical vapor deposition is employed, the single crystalline silicon substrate 10 is placed in a vacuum environment, of which the base pressure can vary as discussed above. Low pressure chemical vapor deposition (LPCVD) process or plasma enhanced chemical vapor deposition (PECVD) may be employed. Energy to decompose one or more reactant gases is provided by thermal energy, whereas energy to decompose one or more reactant gases is provided by plasma energy. A germanium-containing reactant gas, which includes at least one atom of germanium, is flowed into the deposition chamber. Exemplary germanium-containing reactant gases include $GeH_4$, $GeH_2Cl_2$, $GeCl_4$, and $Ge_2H_6$. If silicon is incorporated into the germanium-containing layer 20, a silicon-containing reactant gas including at least one atom of silicon, e.g., $SiH_4$, $SiH_2Cl_2$, $SiHCl_3$, $SiCl_4$, and $Si_2H_6$, can be flowed into the deposition chamber. Atomic layer deposition can employ the same reactants and/or dopants as chemical vapor deposition.

If vacuum evaporation is employed, germanium and/or silicon can be evaporated from an evaporation source, which can be an electron beam source or an effusion cell. Typically, the evaporation source is heated at or near the melting temperature of the source material, i.e., the melting temperature of germanium or the melting temperature of silicon. Oxygen can be provided by background level residual oxygen in a vacuum system having a base pressure greater than $10^{-6}$ Torr. Alternatively or in addition, oxygen gas can be continually or intermittently provided into the deposition chamber from an oxygen source such as a mass flow controller connected to an oxygen tank. Alternatively or in addition, oxygen can be provided to the top surface of the germanium-containing layer 20 and incorporated therein by diffusion.

Optionally, the material stack including the single crystalline silicon substrate 10 and the germanium-containing layer 20 may be maintained at an elevated temperature for a period of time to enhance the degree of epitaxial alignment between the single crystalline silicon substrate 10 and the germanium-containing layer 20 and/or to repair crystalline defects in the germanium-containing layer 20. Because silicon and germanium have the same crystal structures, a crystalline germanium-containing layer 20 would be expected to have a crystallographic orientation epitaxially related to that of the single crystalline silicon substrate 10.

Referring to FIG. 1C, an at least partially crystalline silicon layer 30 having at least some degree of crystallinity is grown directly on the top surface of the germanium-containing layer 20. In one embodiment, the at least partially crystalline silicon layer 30 is a single crystalline layer having a complete epitaxial alignment with the germanium-containing layer 20 at an atomic level. In another embodiment, the at least partially crystalline silicon layer 30 is a textured crystalline layer in which grains are predominantly oriented in a direction providing epitaxial alignment with the single crystalline structure of the germanium-containing layer 20 at an atomic level. In this embodiment, a predominant portion of the grains of the at least partially crystalline silicon layer 30 has the same set of crystallographic orientations as the germanium-containing layer 20. In yet another embodiment, the at least partially crystalline silicon layer 30 is a textured crystalline layer in which grains are predominantly oriented in a direction providing epitaxial alignment with a textured crystalline structure of the germanium-containing layer 20 at an atomic level. In this embodiment, a predominant portion of the grains of the at least partially crystalline silicon layer 30 has the same set of crystallographic orientations as the germanium-containing layer 20.

The thickness of the at least partially crystalline silicon layer 30 is selected to apply sufficient stress to the germanium-containing layer 20 to cause formation of a plurality of cavities 27 within the germanium-containing layer 20 by the end of deposition of the at least partially crystalline silicon layer 30. The thickness of the at least partially crystalline silicon layer 30 needed to generate cavities 27 within the germanium-containing layer 20 depends on the thickness of the germanium-containing layer 20 and the germanium content and the oxygen content in the germanium-containing layer 20. In general, the thickness of the at least partially crystalline silicon layer 30 is at least equal to the thickness of the germanium-containing layer 20, and is typically greater than twice the thickness of the germanium-containing layer 20. In case the germanium-containing layer 20 includes silicon in addition to germanium and oxygen, the thickness of the at least partially crystalline silicon layer 30 can be greater than three times the thickness of the germanium-containing layer 20. Typically, the at least partially crystalline silicon layer 30 has a thickness that is greater than 100 nm. For example, the thickness of the at least partially crystalline silicon layer 30 can be from 100 nm to 500 nm, although lesser and greater thicknesses can also be employed.

The plurality of cavities 27 is formed during the epitaxial growth of the at least partially crystalline silicon layer 30, i.e., before the completion of deposition of the silicon material of the at least partially crystalline silicon layer 30. The lateral dimensions of the plurality of cavities 27 is on the same order of magnitude as the thickness of the germanium-containing layer 20. Typically, each cavity in the plurality of cavities has a maximum lateral dimension less than 200 nm.

The at least partially crystalline silicon layer 30 is grown in a vacuum environment in which oxygen partial pressure is minimal or in an ambient in which oxygen partial pressure is minimized. Any oxygen incorporated in the at least partially crystalline silicon layer 30 is maintained below 5% in atomic concentration, and preferably below 2% in atomic concentration, and most preferably as low as possible.

The at least partially crystalline silicon layer 30 can be deposited by chemical vapor deposition (CVD) or vacuum evaporation. The deposition temperature is set at a temperature that provides sufficient surface diffusion to silicon atoms. For example, the deposition temperature can be from 500° C. to 1,100° C., and typically from 500° C. to 700° C. The pressure of the deposition chamber can vary depending on the deposition process employed. In general, chemical vapor deposition processes employ deposition conditions including a total pressure from 0.1 Torr to 10 Torr, and typically from 0.2 Torr to 5 Torr. A predominant portion of the total pressure is the partial pressure of a carrier gas such as hydrogen gas. If vacuum evaporation or atomic layer deposition is employed, the deposition pressure is typically from $10^{-6}$ Torr to $10^{-3}$ Torr.

In case chemical vapor deposition is employed, the stack of the single crystalline silicon substrate 10 and the germanium-containing layer 20 is placed in a vacuum environment such that the top surface of the germanium-containing layer 20 is exposed. Low pressure chemical vapor deposition (LPCVD) process or plasma enhanced chemical vapor deposition (PECVD) may be employed. A silicon-containing reactant gas including at least one atom of silicon, e.g., $SiH_4$, $SiH_2Cl_2$, $SiHCl_3$, $SiCl_4$, and $Si_2H_6$, is flowed into the deposition chamber. The at least partially crystalline silicon layer 30 can be doped in-situ with p-type dopants or n-type dopants by concurrently flowing dopant gases such as $B_2H_6$, $PH_3$, $AsH_3$, $SbH_3$, or a combination thereof. If vacuum evaporation is employed, silicon can be evaporated from an evaporation source, which can be an electron beam source or an effusion cell.

Optionally, the material stack including the single crystalline silicon substrate 10, the germanium-containing layer 20, and the at least partially crystalline silicon layer 30 may be maintained at an elevated temperature for a period of time to enhance the degree of epitaxial alignment between the germanium-containing layer 20 and the at least partially crystalline silicon layer 30 and/or to repair crystalline defects in the at least partially crystalline silicon layer 30.

Referring to FIG. 1D, a handle substrate 40 is attached to the top surface of the at least partially crystalline silicon layer 30, for example, by bonding. The handle substrate 40 can include a dielectric material layer, a conductive material layer, a polycrystalline semiconductor material layer, a single crystalline semiconductor material layer, or a combination thereof. In non-limiting exemplary cases, the handle substrate 40 can be a glass substrate or a metal substrate. Any bonding method known in the art may be employed including anodic bonding, in which an electrical bias voltage is applied across the interface between the at least partially crystalline silicon layer 30 and the handle substrate 40. Typically, the handle substrate 40 is thick enough to allow mechanical handling without significant risk of breakage. For example, the handle substrate 40 can have a thickness from 200 microns to 5 mm, and typically from 500 microns to 1 mm, although lesser and greater thicknesses can also be employed.

Referring to FIG. 1E, the first exemplary semiconductor structure is cleaved along a plane, which is herein referred to as a "cleavage plane," located within the germanium-containing layer 20. An upper assembly of the handle substrate 40 and the at least partially crystalline silicon layer 30 and an upper portion of the germanium-containing layer 20, which is herein referred to as an upper epitaxial germanium-containing portion 27B, is cleaved off a lower assembly including the single crystalline silicon substrate 10 and a lower portion of the germanium-containing layer 20, which is herein referred to as a lower epitaxial germanium-containing portion 27A, along the cleavage plane.

Treatment of the first exemplary semiconductor structure by any chemical treatment, thermal treatment, or ion implantation is not necessary because the germanium-containing layer 20 is under stress induced by the lattice mismatch with the single crystalline silicon substrate 10 and the at least partially crystalline silicon layer 30. Thus, mechanical shear stress applied to the first exemplary semiconductor structure (i.e., twisting the upper assembly (40, 30, 20B) relative to the lower assembly (10, 20A)) or mechanical tensile stress applied the first exemplary semiconductor structure (i.e., pulling the upper assembly (40, 30, 20B) away from the lower assembly (10, 20A)) can separate the upper assembly (40, 30, 20B) from the lower assembly (10, 20A).

Referring to FIG. 1F, the upper germanium-containing portion 27B is removed selective to the at least partially crystalline silicon layer 30 by an etch or planarization. The etch can be an isotropic etch such as a wet etch employing hydrogen peroxide that removes germanium or a silicon-germanium alloy with a high atomic percentage of germanium (i.e., at least 30% of germanium in atomic concentration), or a dry etch such as a reactive ion etch that is selective to silicon. Alternately or in addition, chemical mechanical planarization can be employed to remove the upper germanium-containing portion 27B. The upper assembly at this point includes a stack of the handle substrate 40 and the at least partially crystalline silicon layer 30.

Referring to FIG. 2A, a second exemplary semiconductor structure according to a second embodiment of the present disclosure includes a single crystalline silicon substrate 10, which is the same as the single crystalline silicon substrate 10 of the first embodiment.

Referring to FIG. 2B, a stack of a germanium-containing layer 20 and a graded germanium-containing layer 22 are grown on the single crystalline at least partially crystalline silicon layer 10. Each of the germanium-containing layer 20 and the graded germanium-containing layer 22 can be deposited by chemical vapor deposition, vacuum evaporation, or atomic layer deposition as described in the first embodiment.

The germanium-containing layer 20 includes oxygen at an atomic concentration between 1% and 50%, and typically between 2% and 20%. The germanium-containing layer 20 has a substantially constant germanium concentration at an atomic concentration from 30% to 99%. In one case, the germanium-containing layer 20 can include germanium and oxygen, and the sum of the atomic concentration of germanium and the atomic concentration of oxygen is greater than 99%. The germanium-containing layer 20 may consist essentially of germanium and oxygen, and the sum of the atomic concentration of germanium and the atomic concentration of oxygen is greater than 99%. In another case, the germanium-containing layer 20 can include germanium, silicon, and oxygen, and the sum of the atomic concentration of germanium, the atomic concentration of silicon, and the atomic concentration of oxygen is greater than 99%. The germanium-containing layer 20 may consist essentially of germanium, silicon, and oxygen, and the sum of the atomic concentration of germanium, the atomic concentration of silicon, and the atomic concentration of oxygen is greater than 99%. In yet another case, the germanium-containing layer 20 can include germanium, silicon, at least another atom, and oxygen, and the sum of the atomic concentration of germanium, the atomic concentration of silicon, the atomic concentration of the at least another atom, and the atomic concentration of oxygen is greater than 99%. The germanium-containing layer 20 may consist essentially of germanium, silicon, at least another atom, and oxygen, and the sum of the atomic concentration of germanium, the atomic concentration of silicon, the atomic concentration of the at least another atom, and the atomic concentration of oxygen is greater than 99%. The at least another atom can be carbon, a p-type dopant such as boron, gallium, or indium, an n-type dopant such as phosphorus, arsenic, or antimony, any other impurity atoms such as nitrogen, fluorine, hydrogen, or argon, or a combination thereof.

The graded germanium-containing layer 22 includes silicon, germanium, and oxygen. The atomic concentration of germanium decreases in the graded germanium-containing layer 22 with the distance from the germanium-containing layer 20. Thus, the atomic concentration of germanium in the graded germanium-containing layer 22 has variable values, which can be in a range from 0% and 99%. The atomic concentration of germanium in the graded germanium-containing layer 22 has a maximum value that is at least 50%, which occurs at or near the interface with the germanium-containing layer 20. In one case, the graded germanium-containing layer 22 can include germanium, silicon, and oxygen, and the sum of the atomic concentration of germanium, the atomic concentration of silicon, and the atomic concentration of oxygen is greater than 99% in each location within the graded germanium-containing layer 22. The graded germanium-containing layer 22 may consist essentially of germanium, silicon, and oxygen, and the sum of the atomic concentration of germanium, the atomic concentration of silicon, and the atomic concentration of oxygen is greater than 99% in each location within the graded germanium-containing layer 22. In another case, the graded germanium-containing layer 22 can include germanium, silicon, at least another atom, and oxygen, and the sum of the atomic concentration of germanium, the atomic concentration of silicon, the atomic concentration of the at least another atom, and the atomic concentration of oxygen is greater than 99% in each location within the graded epitaxial germanium-containing layer 22. The graded germanium-containing layer 22 may consist essentially of germanium, silicon, at least another atom, and oxygen, and the sum of the atomic concentration of germanium, the atomic concentration of silicon, the atomic concentration of the at least another atom, and the atomic concentration of oxygen is greater than 99% in each location within the graded germanium-containing layer 22. The at least another atom can be carbon, a p-type dopant such as boron, gallium, or indium, an n-type dopant such as phosphorus, arsenic, or antimony, any other impurity atoms such as nitrogen, fluorine, hydrogen, or argon, or a combination thereof.

In one embodiment, the germanium-containing layer 20 and the graded germanium-containing layer 22 are at least partially epitaxially aligned with silicon substrate 10. The combined thickness of the stack of the germanium-containing layer 20 and the graded germanium-containing layer 22 is maintained not to exceed the critical thickness at which the epitaxial alignment between the single crystalline silicon substrate 10 and the germanium-containing layer 20 is destroyed through stress relaxation. In general, the thickness of the stack of the germanium-containing layer 20 and the graded germanium-containing layer 22 is between 5 nm and 100 nm, and preferably between 10 nm and 80 nm, although lesser and greater thicknesses can also be employed depending on the concentration levels of germanium in the stack of the germanium-containing layer 20 and the graded germanium-containing layer 22, provided that the at least partial epitaxial alignment between the germanium-containing layer 20, the graded germanium-containing layer 22, and the single crystalline silicon substrate 10 is maintained.

Optionally, the material stack including the single crystalline silicon substrate 10 and the stack of the germanium-containing layer 20 and the graded germanium-containing layer 22 may be maintained at an elevated temperature for a period of time to enhance the degree of epitaxial alignment between the single crystalline silicon substrate 10 and the stack of the germanium-containing layer 20 and the graded germanium-containing layer 22 and/or to cure crystalline defects in the stack of the germanium-containing layer 20 and the graded germanium-containing layer 22.

Referring to FIGS. 2C, 2D, 2E, and 2F, the processing steps of FIGS. 1C, 1D, 1E, and 1F are performed as in the first embodiment. At the processing step of FIG. 2C, the thickness of the at least partially crystalline silicon layer 30 is selected to apply sufficient stress to the germanium-containing layer 20 to cause formation of a plurality of cavities 27 within the germanium-containing layer 20 by the end of deposition of the at least partially crystalline silicon layer 30. Depending on the relative germanium concentrations in the germanium-containing layer 20 and in the graded germanium-containing layer 22 and the relative thicknesses of the germanium-containing layer 20 and in the graded germanium-containing layer 22, the plurality of cavities 27 may be formed solely within the germanium-containing layer 20 or across the germanium-containing layer 20 and the graded germanium-containing layer 22.

The plurality of cavities 27 is formed during the growth of the at least partially crystalline silicon layer 30, i.e., before the completion of deposition of the silicon material of the at least partially crystalline silicon layer 30. The lateral dimensions of the plurality of cavities 27 is on the same order of magnitude as the combined thickness of the germanium-containing layer 20 and the graded germanium-containing layer 22. Typically, each cavity in the plurality of cavities has a maximum lateral dimension less than 200 nm. While the cleavage plane in FIG. 2E is illustrated as passing only through the germanium-containing layer 20, it is understood that the cleavage plane may pass through the graded germanium-containing layer 22 in some of the cases where the plurality of cavities 27 is formed across the germanium-containing layer 20 and the graded germanium-containing layer 22. Remnants of the germanium-containing layer 20 and the graded germanium-containing layer 22 are removed at the processing steps of FIG. 2F employing the same methods as in the first embodiment.

Referring to FIGS. 3A, 3B, and 3C, a third exemplary semiconductor structure according to a third embodiment of the present disclosure is the same as the first exemplary semiconductor structure as shown in FIGS. 1A, 1B, and 1C, respectively, and can be formed by employing the same processing steps.

Referring to FIG. 3D, a bonding material layer 42 may be employed to bond the at least partially crystalline silicon layer 30 to the handle substrate 40. The bonding material layer 42 can be a semiconductor oxide layer form on the handle substrate 10 if the handle substrate includes a semiconductor material that can be converted into a semiconductor oxide such as silicon oxide or germanium oxide. Alternately, the bonding material layer 42 can be an adhesive layer that includes resin, polymer, epoxy, or any other material that can be employed as an adhesive.

Referring to FIGS. 3E and 3F, the processing steps of FIGS. 1E and 1F are performed as in the first embodiment.

Figure 4B:
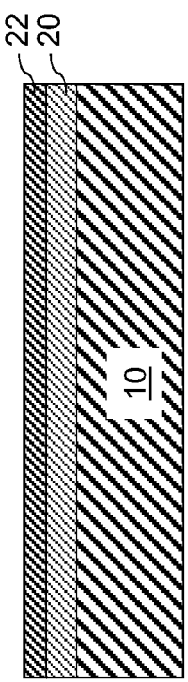
Figure 4C:
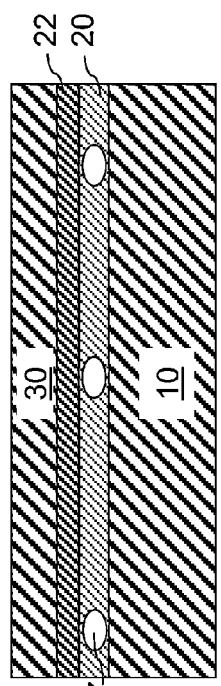

Referring to FIGS. 4A, 4B, and 4C, a fourth exemplary semiconductor structure according to a fourth embodiment of the present disclosure is the same as the second exemplary semiconductor structure as shown in FIGS. 2A, 2B, and 2C, respectively, and can be formed by employing the same processing steps.

Figure 4D:
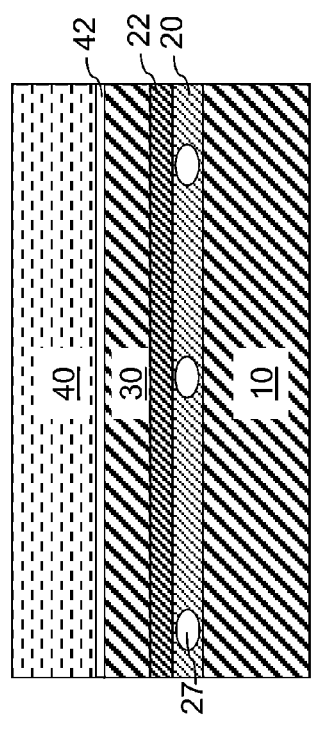
Figure 4E:
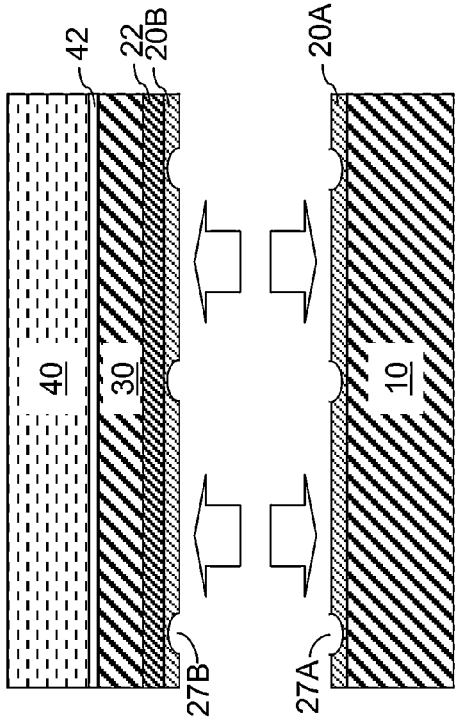
Figure 4F:
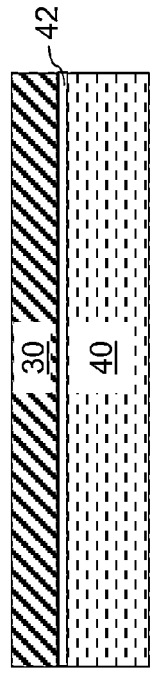

Referring to FIGS. 4C, 4D, and 4F, the fourth exemplary semiconductor structure according to the fourth embodiment of the present disclosure can be formed employing the same processing steps as shown in FIGS. 3A, 3B, and 3C, respectively, and can be formed by employing the same processing steps.

Figure 5:
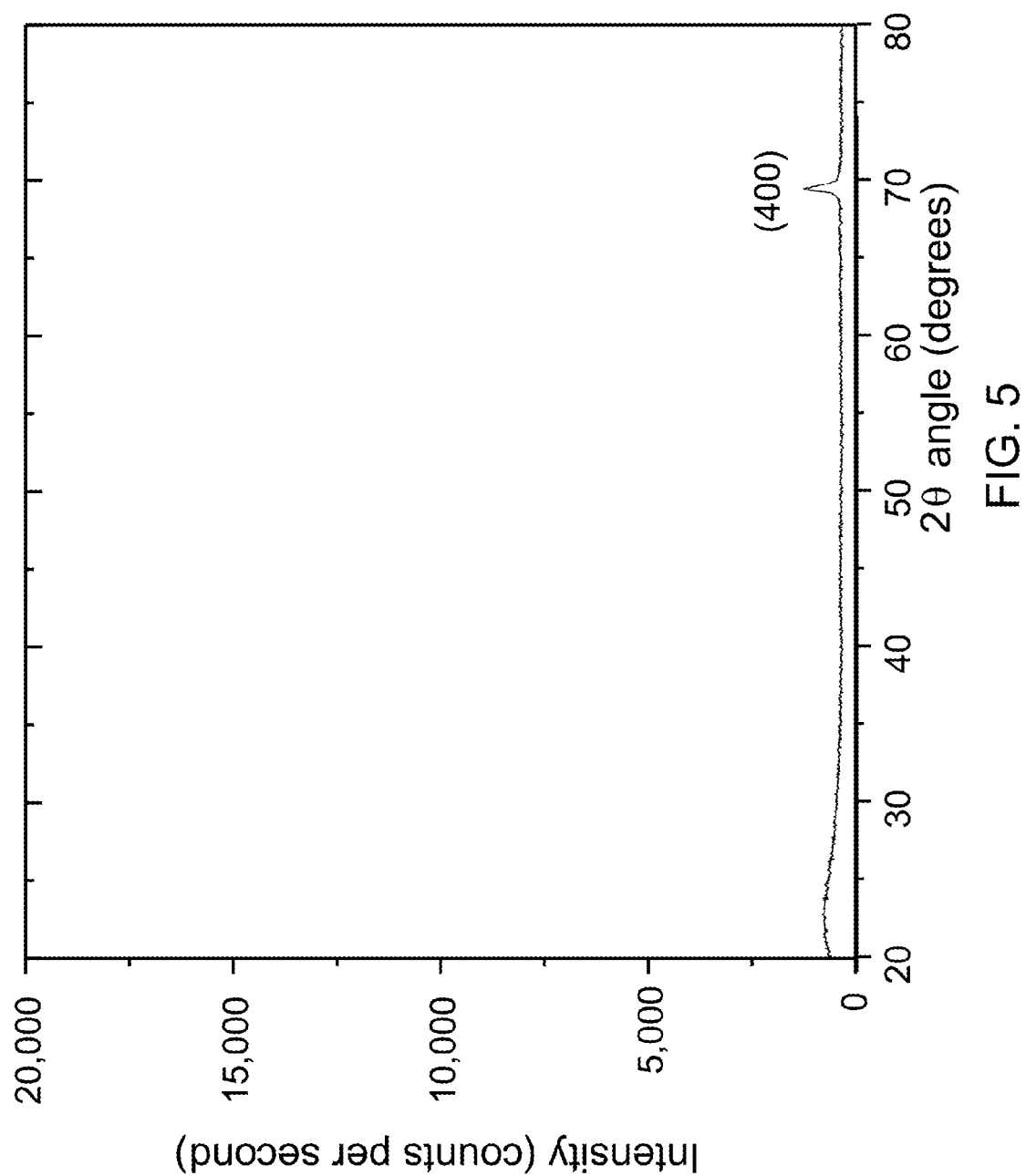
FIG. 5 is a graph of an X-ray diffraction data from a first sample according to the first embodiment of the present disclosure as a function of 2θ.

Referring to FIG. 5, a graph of an X-ray diffraction data from a first sample according to the first embodiment of the present disclosure is illustrated as a function of $2\theta$. Specifically, the first sample includes a stack of a handle substrate 10 and a at least partially crystalline silicon layer 30 as illustrated in FIG. 1F. The handle substrate 10 had an amorphous material (and thereby not contributing any sharp peak to the X-ray diffraction data), and the at least partially crystalline silicon layer 30 had a thickness of 300 nm. To manufacture the first sample, a germanium-containing layer 20 (see FIGS. 1B-1D) consisting essentially of germanium and oxygen and having a thickness of 30 nm was employed. The single peak at $2\theta$ of approximately 69 degrees indicates that the at least partially crystalline silicon layer 30 within the first sample is a single crystalline silicon layer having a (100) surface orientation or a textured crystalline layer in which a predominant portion of grains is aligned along a (100) surface orientation and has a high quality of crystallinity.

Figure 6:
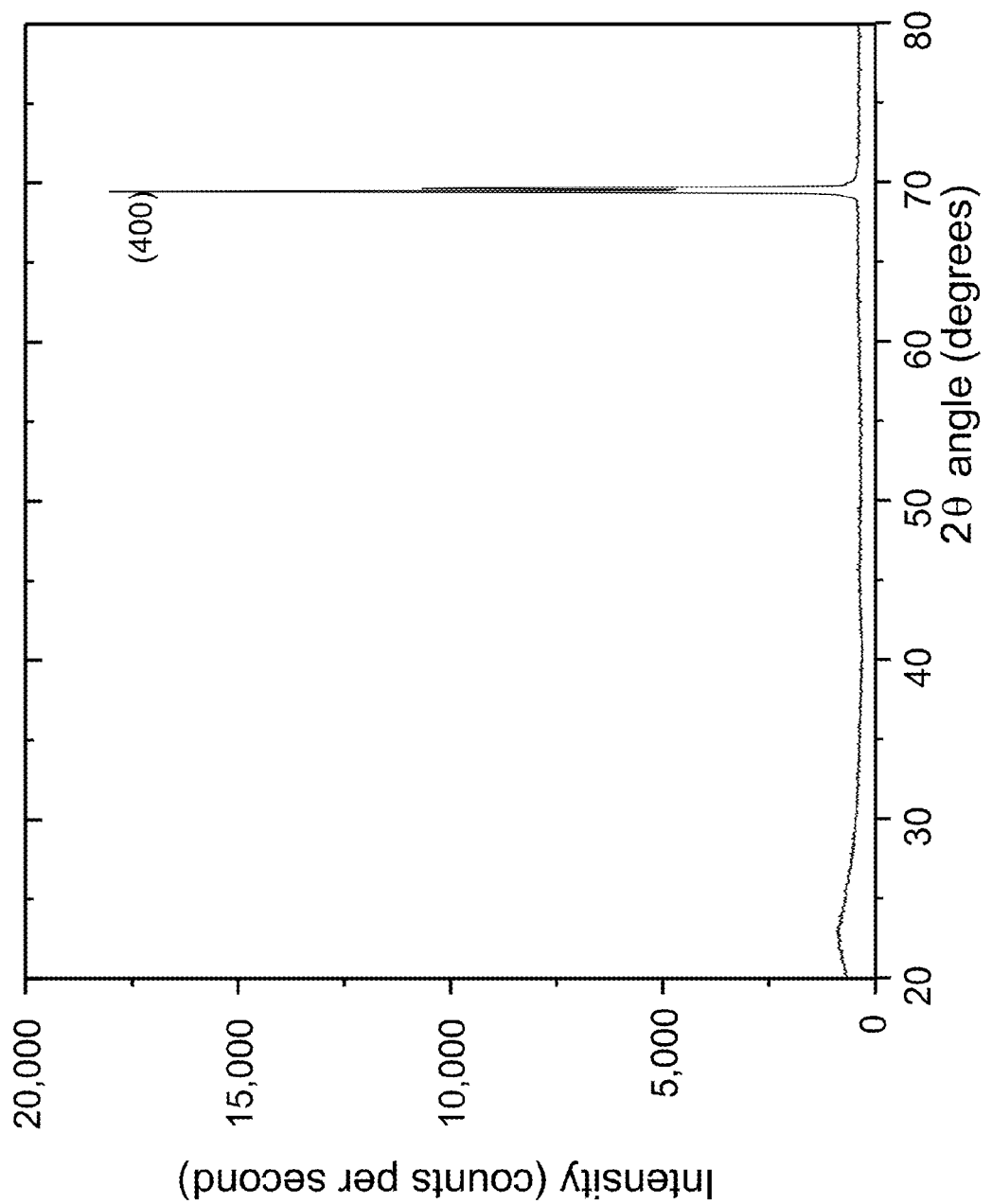
FIG. 6 is a graph of an X-ray diffraction data from a second sample according to the second embodiment of the present disclosure as a function of 2θ.

Referring to FIG. 6, a graph of an X-ray diffraction data from a second sample according to the second embodiment of the present disclosure is illustrated as a function of $2\theta$. Specifically, the second sample includes a stack of a handle substrate 10 and an at least partially crystalline silicon layer 30 as illustrated in FIG. 1F. The handle substrate 10 had an amorphous material (and thereby not contributing any sharp peak to the X-ray diffraction data), and the at least partially crystalline silicon layer 30 had a thickness of 120 nm. To manufacture the second sample, a stack of an germanium-containing layer 20 and a graded germanium-containing layer 22 (See FIGS. 2B-2D) was employed. The germanium-containing layer 20 consisted essentially of germanium and oxygen and had a thickness of 30 nm. The graded germanium-containing layer 22 consisted essentially of germanium, silicon, and oxygen, and had a thickness of 50 nm. The single peak at $2\theta$ of approximately 69 degrees suggests that the at least partially crystalline silicon layer 30 within the second sample is a single crystalline silicon layer having a (100) surface orientation or a textured crystalline layer in which a predominant portion of grains is aligned along a (100) surface orientation and has an even higher quality of crystallinity than the first sample of FIG. 5.

Figure 7:
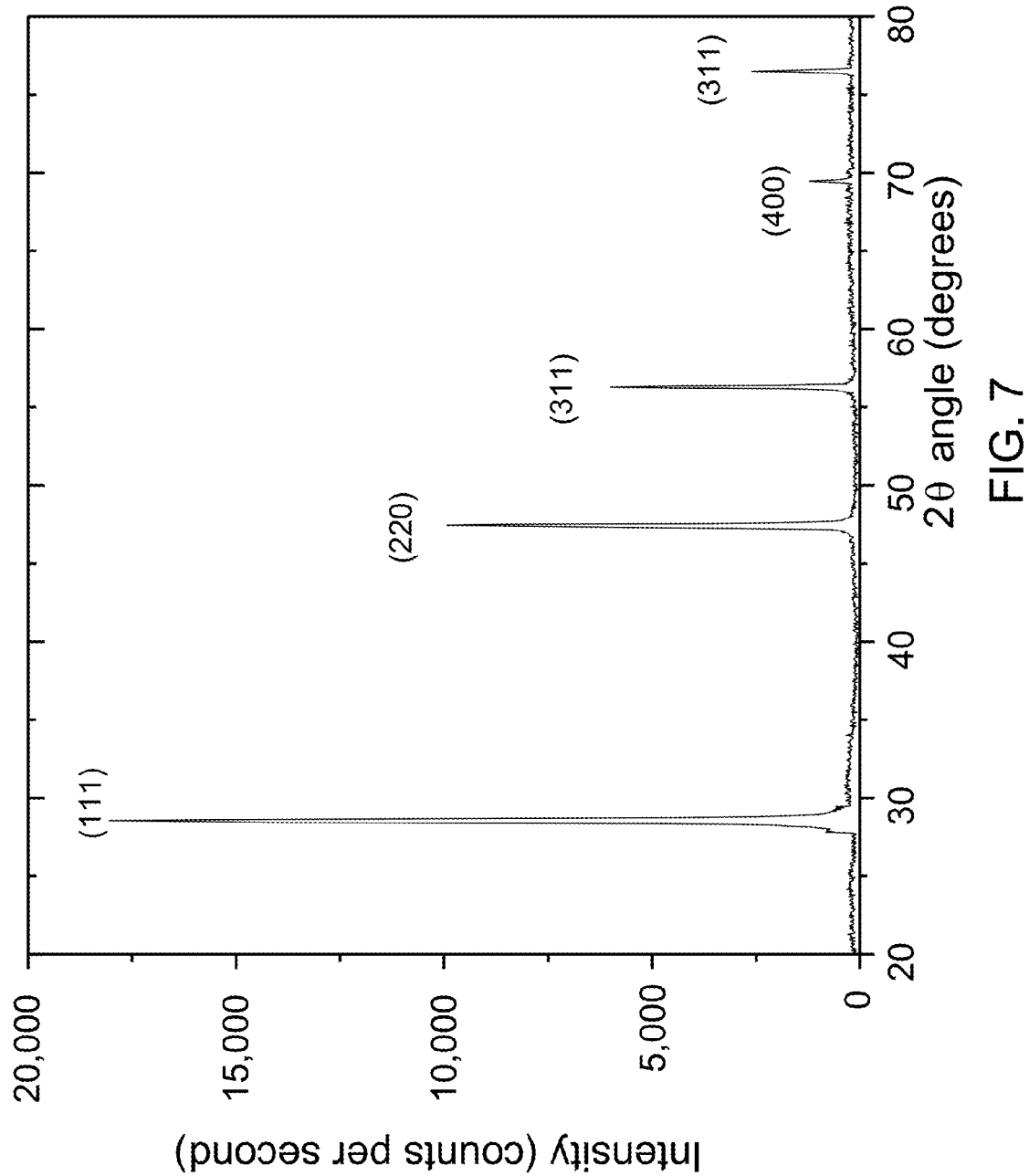
FIG. 7 is a graph of an X-ray diffraction data from a third sample including a polysilicon film as a function of 2θ.

For illustrative purposes, an X-ray diffraction data from a third sample including a polysilicon film as a function of $2\theta$ is shown in FIG. 7. The polysilicon film of the third sample provided multiple peaks corresponding to various crystallographic orientations in the grains of the polysilicon film.

Figure 8:
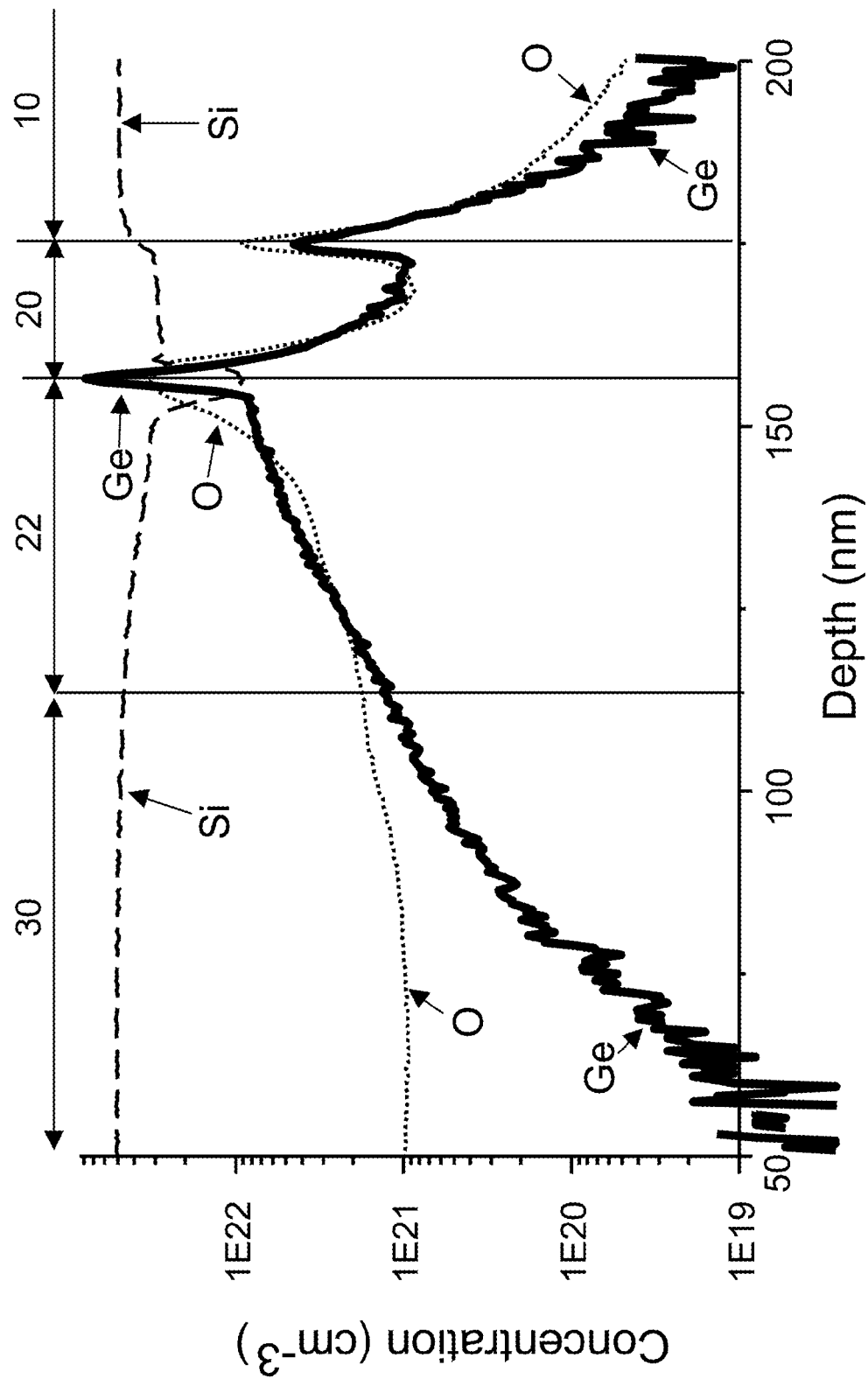
FIG. 8 is a graph illustrating data from a secondary ion mass spectroscopy (SIMS) run on the second sample according to the second embodiment of the present disclosure.

Referring to FIG. 8, a graph illustrates data from a secondary ion mass spectroscopy (SIMS) run on the second sample of FIG. 6 prior to cleavage, i.e., the second sample according to the second embodiment of the present disclosure at the step of FIG. 2C. The atomic concentrations of germanium, silicon, and oxygen are shown by three curves labeled "Ge," "Si," and "O," respectively. The graph in FIG. 8 is divided into portions corresponding to the various structural elements in the first exemplary semiconductor structure of FIG. 2C, and each portion is labeled with the corresponding reference numeral in the first exemplary semiconductor structure of FIG. 2C.

Figure 9:
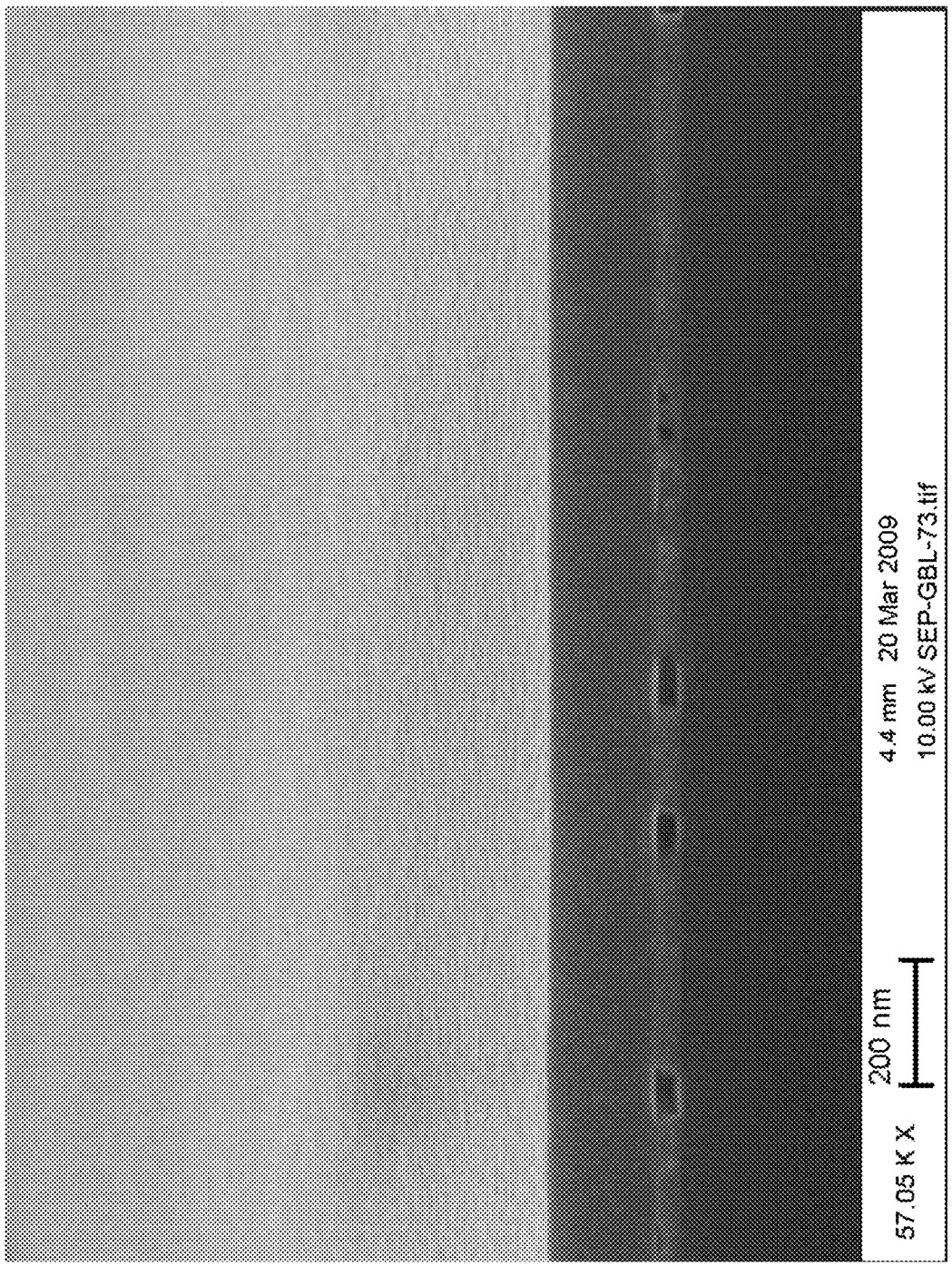
FIG. 9 is a scanning electron micrograph (SEM) of a broken portion of the first sample along a vertical cleavage plane without cleaving along the oxygen-containing germanium layer.

Referring to FIG. 9, a scanning electron micrograph (SEM) is shown of a broken portion of the first sample along a vertical cleavage plane at a step corresponding to FIG. 1C, i.e., prior to attaching a handle substrate 10 or cleaving along the oxygen-containing germanium layer 20. This SEM shows, from bottom to top, a vertical surface of a single crystalline silicon substrate 10 as cleaved for SEM preparation, a vertical surface of an oxygen-containing germanium layer 20 as cleaved for SEM preparation, and a vertical surface of an at least partially crystalline silicon layer 30 as cleaved for SEM preparation, and a top surface of the at least partially crystalline silicon layer 30. A plurality of cavities is shown in the oxygen-containing germanium layer 20 in dark color.

Figure 10:
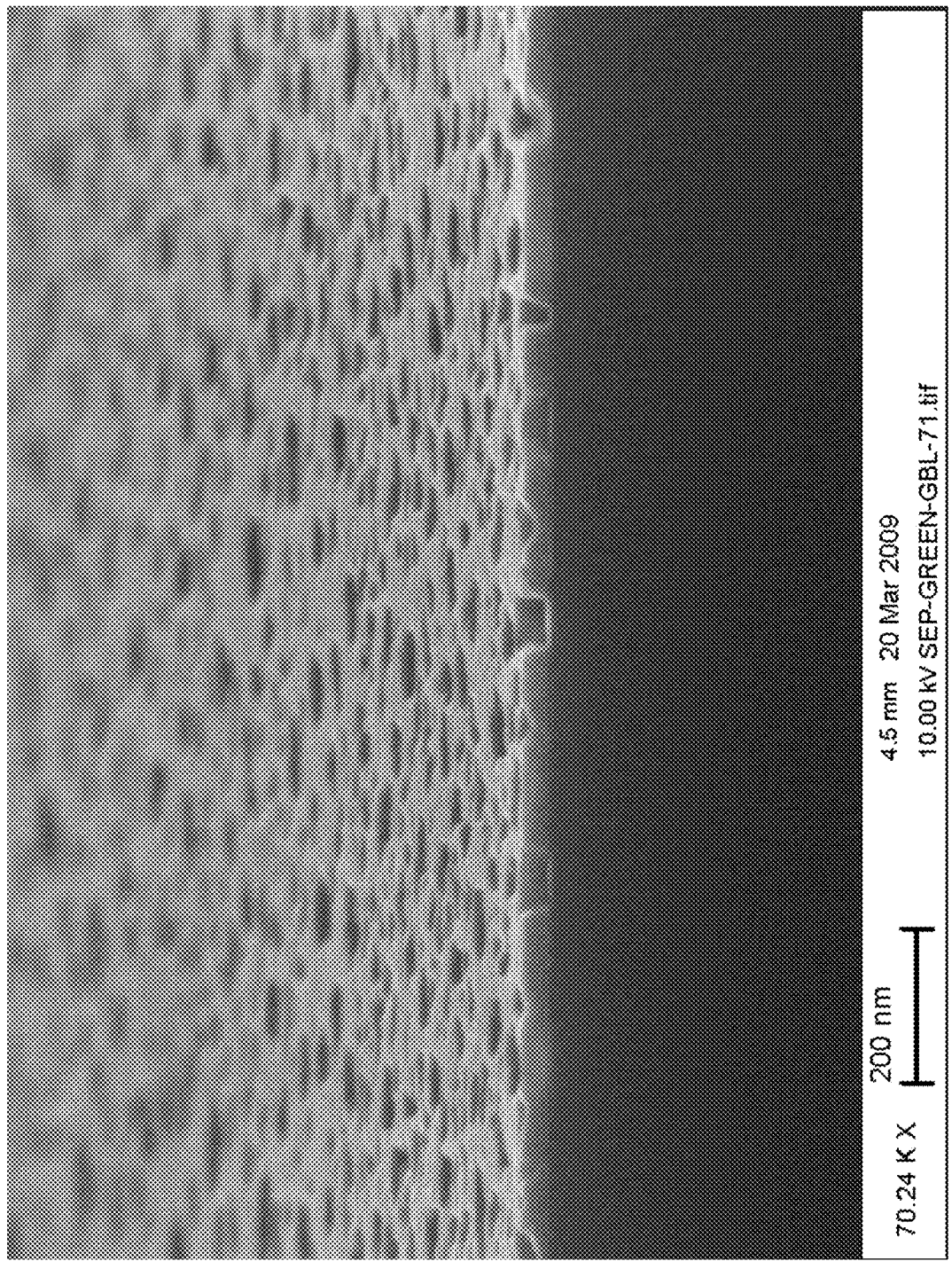
FIG. 10 is a scanning electron micrograph (SEM) of a portion of the first sample, which was cleaved along the oxygen-containing germanium layer and includes the bulk silicon substrate and a portion of the oxygen-containing germanium layer.

Referring to FIG. 10, a scanning electron micrograph (SEM) is shown of a portion of the first sample, which was cleaved along a plane in the oxygen-containing germanium layer 20 at a step corresponding to FIG. 1E. This portion of the first sample includes a bulk silicon substrate 10 and a portion of the oxygen-containing germanium layer 22, i.e., a lower germanium-containing portion 27A. This SEM shows, from bottom to top, a vertical surface of the single crystalline silicon substrate 10 as cleaved for SEM preparation, a vertical surface of the lower germanium-containing portion 27A as cleaved for SEM preparation, and a top surface of the lower germanium-containing portion 27A. A plurality of cavities is shown on the top surface of the lower germanium-containing portion 27A in dark color.

While the present disclosure has been particularly shown and described with respect to preferred embodiments thereof, it will be understood by those skilled in the art that the foregoing and other changes in forms and details can be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising a material stack, said material stack including:
    a single crystalline silicon substrate;
    a germanium-containing layer contacting said single crystalline silicon substrate, said germanium-containing layer comprising a plurality of cavities;
    an at least partially crystalline silicon layer located on and directly contacting said germanium-containing layer; and
    a handle substrate bonded to said at least partially crystalline silicon layer.

2. The semiconductor structure of claim 1, wherein said germanium-containing layer includes oxygen at an atomic concentration between 1% and 50%.

3. The semiconductor structure of claim 1, wherein said germanium-containing layer consists essentially of germanium and oxygen, wherein a sum of an atomic concentration of germanium and an atomic concentration of oxygen is greater than 99%.

4. The semiconductor structure of claim 1, wherein said germanium-containing layer has a substantially constant germanium concentration at an atomic concentration from 30% to 99%.

5. The semiconductor structure of claim 1, wherein said germanium-containing layer includes oxygen at an atomic concentration between 1% and 50%.

6. The semiconductor structure of claim 5, wherein said germanium-containing layer includes oxygen at an atomic concentration between 2% and 20%.

7. The semiconductor structure of claim 5, wherein oxygen incorporated in said at least partially crystalline silicon layer 30 is below 5% in atomic concentration.

8. The semiconductor structure of claim 1, wherein said germanium-containing layer is a single crystalline layer having an epitaxial alignment with said single crystalline silicon substrate at an atomic level.

9. The semiconductor structure of claim 1, wherein said at least partially crystalline silicon layer is another single crystalline layer having a complete epitaxial alignment with said germanium-containing layer at an atomic level.

10. The semiconductor structure of claim 1, wherein said germanium-containing layer is a textured crystalline layer in which grains are predominantly oriented in a direction providing epitaxial alignment with a single crystalline structure of said single crystalline silicon substrate at an atomic level.

11. The semiconductor structure of claim 10, wherein said at least partially crystalline silicon layer is another textured crystalline layer in which grains are predominantly oriented in a direction providing epitaxial alignment with said single crystalline structure of said germanium-containing layer at an atomic level.

12. The semiconductor structure of claim 1, wherein a predominant portion of grains of said germanium-containing layer has the same set of crystallographic orientations as said single crystalline silicon substrate.

13. The semiconductor structure of claim 12, wherein a predominant portion of grains of said at least partially crystalline silicon layer has the same set of crystallographic orientations as said germanium-containing layer.

14. The semiconductor structure of claim 1, wherein said germanium-containing layer is polycrystalline.

15. The semiconductor structure of claim 1, wherein said germanium-containing layer is aligned to said single crystalline silicon substrate with at least some degree of epitaxial alignment.

16. A semiconductor structure comprising a material stack, said material stack including:
    a single crystalline silicon substrate;
    a germanium-containing layer contacting said single crystalline silicon substrate;
    a graded germanium-containing layer located on and directly contacting said germanium-containing layer, wherein said graded germanium-containing layer is epitaxially aligned to said germanium-containing layer or a predominant portion of grains of said graded germanium-containing layer is along a predominant grain orientation in said germanium-containing layer,
    an at least partially crystalline silicon layer located on and directly contacting said graded germanium-containing layer; and
    a handle substrate bonded to said at least partially crystalline silicon layer.

17. The semiconductor structure of claim 16, wherein said graded germanium-containing layer includes silicon, germanium, and oxygen, and an atomic concentration of germanium decreases in said graded germanium-containing layer with a distance from said germanium-containing layer.

18. The semiconductor structure of claim 1, further comprising a bonding material layer in contact with said handle substrate.

19. The semiconductor structure of claim 1, wherein a surface normal of a planar top surface of said single crystalline silicon substrate has a set of Miller indices, wherein at least one Miller index in said set of Miller indices has an absolute value that exceeds 6.

* * * * *